United States Patent
Kwak

(10) Patent No.: US 7,995,403 B2
(45) Date of Patent: Aug. 9, 2011

(54) SEMICONDUCTOR INTEGRATED CIRCUIT WITH DATA BUS INVERSION FUNCTION

(75) Inventor: Seung Wook Kwak, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 396 days.

(21) Appl. No.: 12/345,763

(22) Filed: Dec. 30, 2008

(65) Prior Publication Data

US 2010/0118618 A1    May 13, 2010

(30) Foreign Application Priority Data

Nov. 13, 2008  (KR) .................. 10-2008-0112685

(51) Int. Cl.
*G11C 7/10* (2006.01)
(52) U.S. Cl. ............ 365/189.02; 365/189.05; 365/233.1
(58) Field of Classification Search ............. 365/189.02, 365/189.05, 233.1
See application file for complete search history.

(56) References Cited

U.S. PATENT DOCUMENTS 7,400,541 B2 *   7/2008   Jang et al. ................ 365/189.07

FOREIGN PATENT DOCUMENTS

| KR | 1020060026313 A | 3/2006 |
| KR | 100578219 B1 | 5/2006 |
| KR | 100613463 B1 | 8/2006 |

* cited by examiner

*Primary Examiner* — Son T Dinh
*Assistant Examiner* — Nam T Nguyen
(74) *Attorney, Agent, or Firm* — Ladas & Parry LLP

(57) ABSTRACT

A semiconductor integrated circuit includes a data bus inversion (DBI) flag generating unit to generate DBI flag signals using a plurality of output data sets, a data inverting unit to invert the plurality of output data sets according to the DBI flag signals and transmit the plurality of output data sets through global transmission lines, and a plurality of data output units to output the plurality of output data sets, which are transmitted through the global transmission lines by pads.

12 Claims, 6 Drawing Sheets

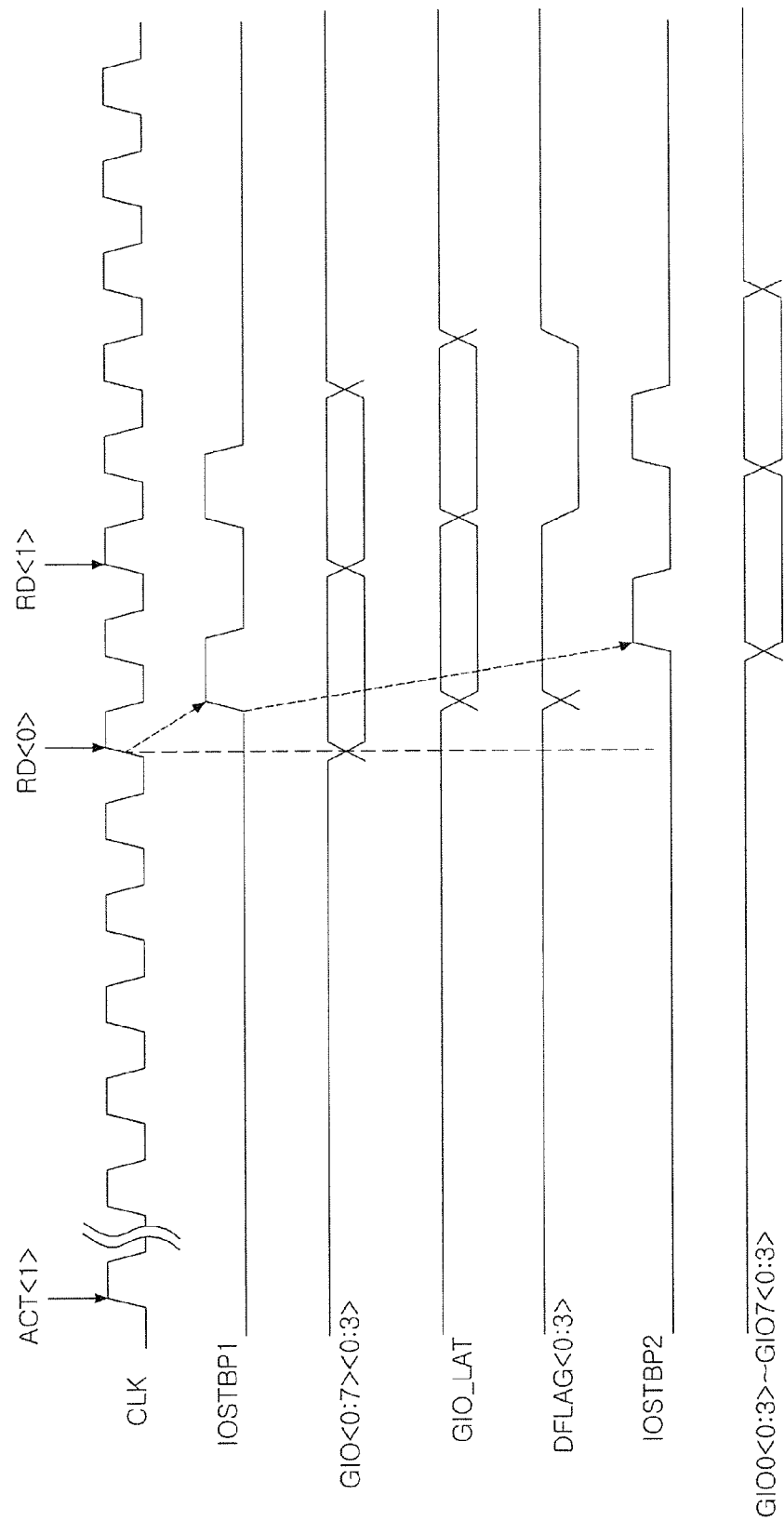

SEMICONDUCTOR INTEGRATED CIRCUIT WITH DATA BUS INVERSION FUNCTION

CROSS-REFERENCES TO RELATED PATENT APPLICATION

The present application claims priority under 35 U.S.C 119(a) to Korean patent Application No. 10-2008-0112685, filed on Nov. 13, 2008, in the Korean Intellectual Property Office, which is incorporated herein by reference in its entirety.

BACKGROUND

The present invention relates generally to a semiconductor integrated circuit (IC) device, and more particularly, to a semiconductor integrated circuit device having a data bus inversion (DBI) function.

FIG. 1 is a block diagram showing a semiconductor integrated circuit (IC) device having a data bus inversion function according to the prior art.

Elements that relate to controlling performance of semiconductor IC devices for storing data are the central processing units (CPU) and/or graphic processing units (GPU). That is, the main memory devices or the graphic memory devices, wherein the data processing speed is one of the most important factors for these devices.

There are various technologies used to improve this data processing speed. One of these technologies currently being used is the data bus inversion (DBI).

For example, according to the data bus inversion function, if the number of data having a high value or a low value is four or more of eight data, current eight data is inverted and transmitted, and if the number of data having a high value or low value is less than four, the current eight data is transmitted without being inverted, wherein the data processing speed is improved by minimizing the number of times the eight data is switched prior to being outputted.

FIG. 1 shows a semiconductor integrated circuit 1 that has a data bus inversion function according to the prior art having a DBI flag generating unit 2, a first to eighth data output units 3 to 10, and a first to eighth pads 11 to 18.

The DBI flag generating unit 2 performs an operation on all of data 'GIO<0:7><0:3>' output from global transmission lines in a memory cell area, and generates DBI flag signals 'DFLAG<0:3>' to define whether data is inverted or not.

The first to eighth data output units 3 to 10 inverts data 'GIO0<0:3>' to 'GIO7<0:3>', which are respectively input to the first to eighth data output units 3 to 10, in accordance with the DBI flag signals 'DFLAG<0:3>', performs delay, multiplexing, and pipe latching processes on the data, and outputs the data to the respective first to eighth pads 11 to 18. On the layout area of the IC, these respective first to eighth data output units 3 to 10 are disposed. Also, in this same layout area of the IC, the data input circuits (not shown) are also disposed.

FIG. 2 shows a block diagram of a first data output unit with the device according to the prior art.

FIG. 2 shows each of the first to eighth data output units 3 to 10 of the prior art having the same structure. As shown in FIG. 2 of the prior art, the first data output unit 3 has a control/delay circuit unit 3-1, an inversion circuit unit 3-2, and a MULTIPLEXING/PIPE LATCH unit 3-3.

The control/delay circuit unit 3-1 and the inversion circuit unit 3-2 delays the data 'GIO0<0:3>' to match the timing of the data 'GIO0<0:3>' and the timing of the DBI flag signals 'DFLAG<0:3>', inverts the data according to the DBI flag signals 'DFLAG<0:3>', and outputs the data.

The MULTIPLEXING/PIPE LATCH unit 3-3 performs a multiplexing and pipe latching operation on the inverted data.

As described above, in the semiconductor integrated circuit disclosed by the prior art in FIGS. 1 and 2, the data bus inversion is performed in each of the first to eighth data output units 3 to 10 in accordance with the DBI flag signals 'DFLAG<0:3>' generated by the DBI flag generating unit 2.

Accordingly, the control/delay circuit unit 3-1 and the inversion circuit unit 3-2 are required in each of the first to eighth data output units 3 to 10, wherein the IC layout area increases. That is, the first to eighth data output units 3 to 10 are disposed in the area where the circuits related to data input are also disposed, which makes designing the semiconductor integrated circuit difficult.

Further, timing of the data and timing of the DBI flag signal need to be matched with respect to each of the first to eighth data output units 3 to 10. By having the control/delay circuit unit 3-1 and the inversion circuit unit 3-2 required in each of the first to eighth data output units 3 to 10, the ability to design timing circuits to perform data input/output control is made more difficult. Consequently, the input/output timings of all of the pads may not be matched with respect to the timing of the data and the DBI flag signal.

SUMMARY OF THE INVENTION

The present invention includes a semiconductor integrated circuit having a data bus inversion function for reducing circuit design area required for data output units for improving stability and accuracy of data input/output control.

In one aspect of the present invention, a semiconductor integrated circuit has a data bus inversion (DBI) function having a DBI flag generating unit to generate DBI flag signals for a plurality of output data sets; a data inverting unit to invert the plurality of output data sets according to the DBI flag signals and transmit the plurality of output data sets through global transmission lines; and a plurality of data output units to output the plurality of output data sets, which are transmitted through the global transmission lines by pads.

In another aspect of the present invention, the semiconductor integrated circuit has a data bus inversion (DBI) function having a plurality of pads; a plurality of data output units to multiplex and latch the input data and output the data to the plurality of pads; global transmission lines connected between a memory cell area and the plurality of data output units; and a data inverting unit connected to the center of the global transmission lines, and invert data transmitted from the memory cell area according to DBI flag signals and output the data to the plurality of data output units.

In another aspect of the present invention, a semiconductor integrated circuit has a data bus inversion (DBI) function having a plurality of data output units to latch data transmitted through global transmission lines in a predetermined order and outputs the data to pads connected to the respective plurality of data output units; and a data inverting unit to invert data output from a memory cell area from the timing of at least one input/output strobe signal in accordance with DBI flag signals and transmit the data to the plurality of data output units through the global transmission lines.

Hence, the semiconductor integrated circuit of the present invention has a data bus inversion function according to an embodiment, wherein the layout area of the circuit design for an IC for the data output units is reduced. Further, the data inversion operation is collectively processed in a separate structure, and not in each of the respective data output units that improves stability and accuracy of the data input/output control, wherein the data input/output control is better facilitated for increasing data processing speed.

These and other features, aspects, and advantages are described below in the section "Detailed Description."

BRIEF DESCRIPTION OF THE DRAWINGS

Features, aspects, and embodiments are described in conjunction with the attached drawings, in which:

FIG. 7 is a timing chart showing the operation of an exemplary semiconductor integrated circuit device according to an embodiment of the present invention.

DETAILED DESCRIPTION

Figure 1:
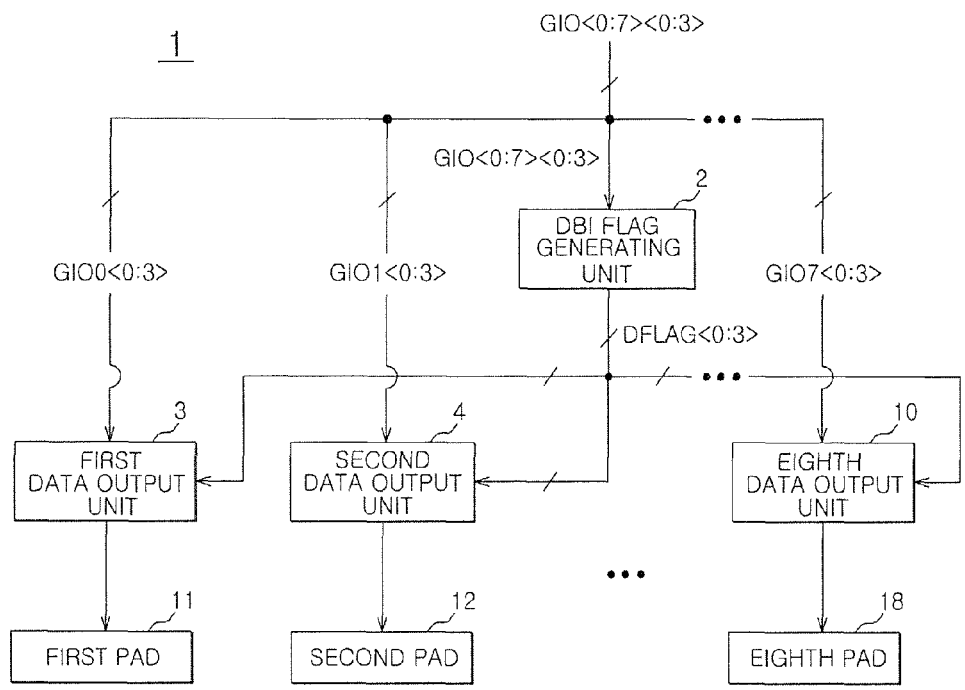
FIG. 1 is a block diagram showing a semiconductor integrated circuit device having a data bus inversion function according to the prior art.
Figure 2:
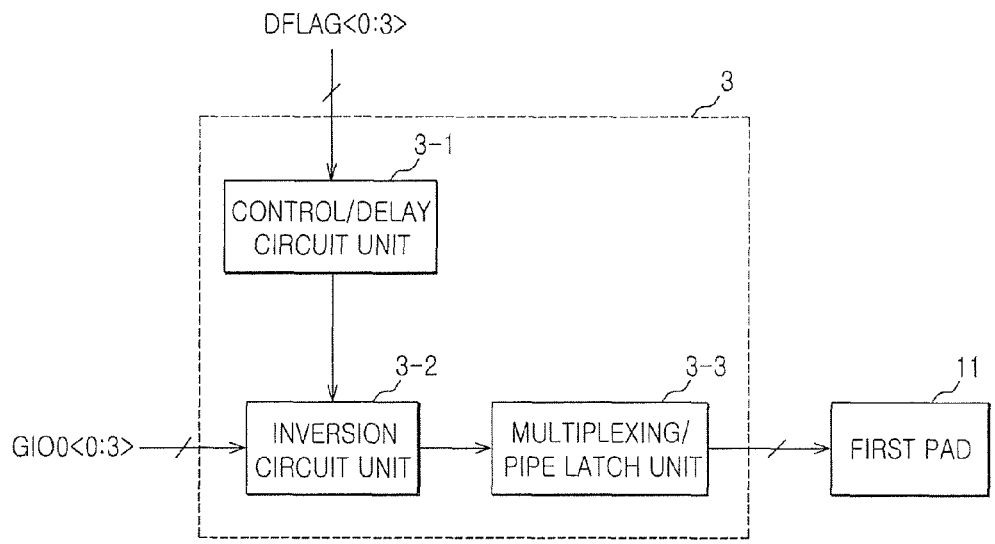
FIG. 2 is a block diagram showing of a first data output unit included with the device according to the prior art.
Figure 3:
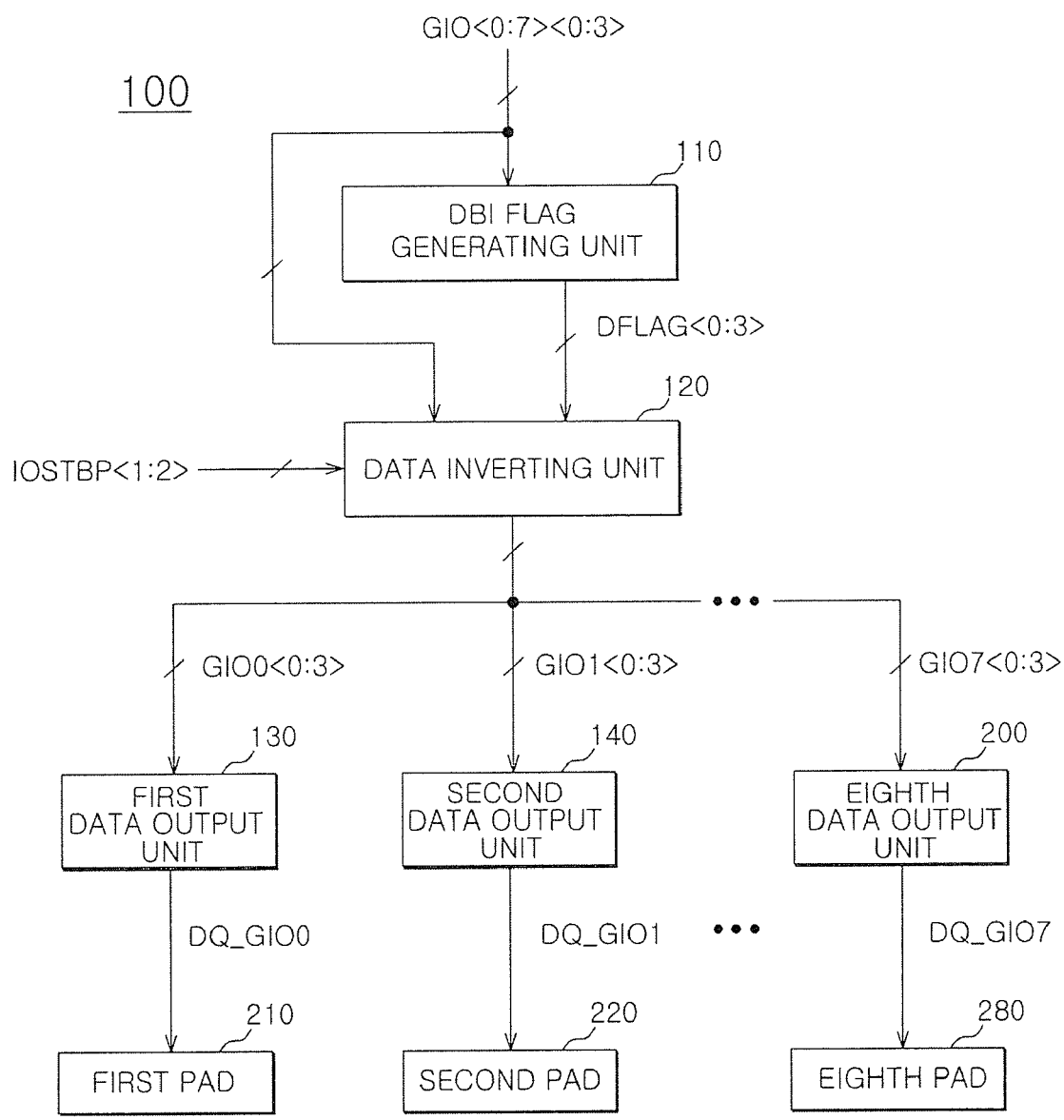
FIG. 3 is a block diagram showing an exemplary semiconductor integrated circuit device having a data bus inversion function according to an embodiment of the present invention.

FIG. 3 is a block diagram showing an exemplary semiconductor integrated circuit device having a data bus inversion function according to an embodiment.

As shown in FIG. 3, the semiconductor integrated circuit has a data bus inversion function according to an embodiment includes a DBI flag generating unit 110, a data inverting unit 120, first to eighth data output units 130 to 200, and first to eighth pads 210 to 280.

The DBI flag generating unit 110 performs a predetermined DBI operation on all of data 'GIO<0:7><0:3>' output through global transmission lines in a memory cell area (i.e., core block) and generates DBI flag signals 'DFLAG<0:3>' used to define whether data is inverted or not.

The global transmission lines may be connected between the memory cell area (not shown) and the first to eighth data output units 130 to 200. The data inverting unit 120 may be connected between the global transmission lines.

The data inverting unit 120 performs a data inversion operation. That is, the data inverting unit 120 latches all of the data 'GIO<0:7><0:3>' transmitted through the global transmission lines based on the timing of a first input/output strobe signal 'IOSTBP<1>', invert the data according to the DBI flag signals 'DFLAG<0:3>', latch the data based on the timing of a second input/output strobe signal 'IOSTBP<2>', and outputs the data to the first to eighth data output units 130 to 200.

The first to eighth data output units 130 to 200 multiplexes data 'GIO0<0:3>' to 'GIO7<0:3>' output from the data inverting unit 120, latches data in a predetermined order, and outputs the data to the first to eighth pads 210 to 280.

The first to eighth data output units 130 to 200 each have the same structure.

Figure 4:
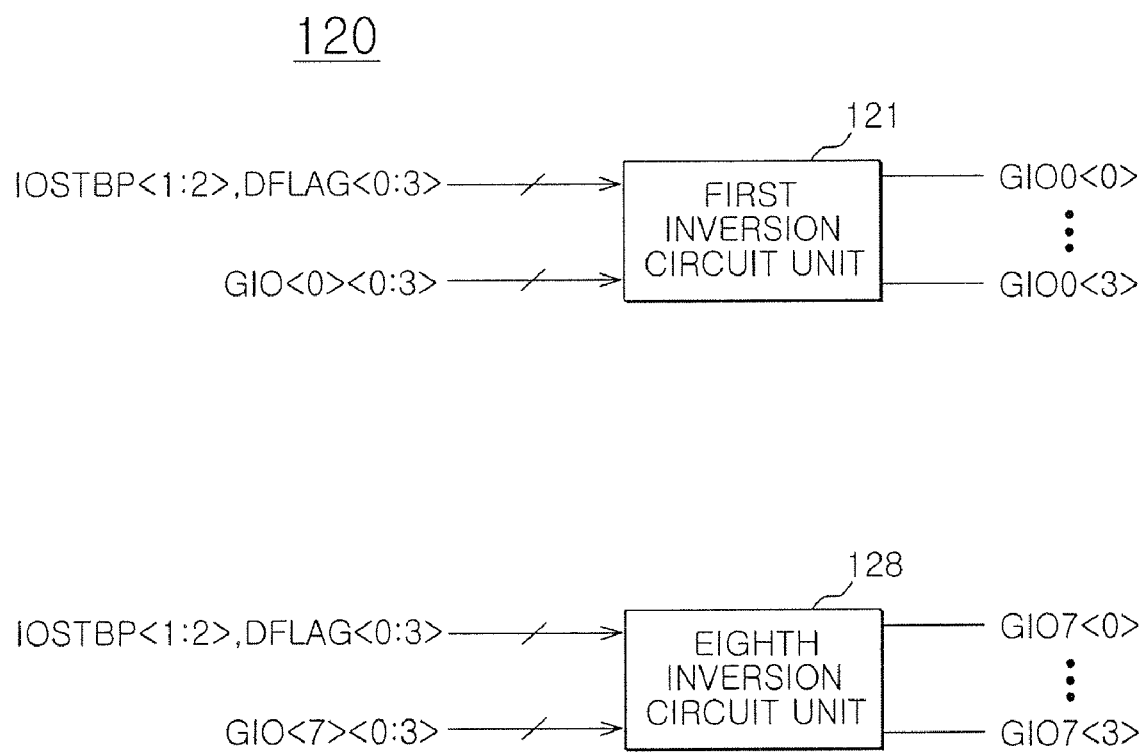
FIG. 4 is a block diagram showing an internal structure of an exemplary data inverting unit included with the device according to an embodiment of the present invention.

FIG. 4 is a block diagram showing an internal structure of an exemplary data inverting unit included with the device according to an embodiment.

As shown in FIG. 4, the data inverting unit 120 includes a first to eighth inversion circuit units 121 to 128 to perform a data inversion operation on each of data sets 'GIO<0><0:3>' to 'GIO<7><0:3>'.

Each of the first to eighth inversion circuit units 121 to 128 receives the first input/output strobe signal 'IOSTBP<1>', the second input/output strobe signal 'IOSTBP<2>', and the DBI flag signals 'DFLAG<0:3>', and receives data of each of the first to eighth inversion circuit units 121 to 128 'GIO0<0:3>' to 'GIO7<0:3>'.

The first to eighth inversion circuit units 121 to 128 each have the same structure.

Figure 5:
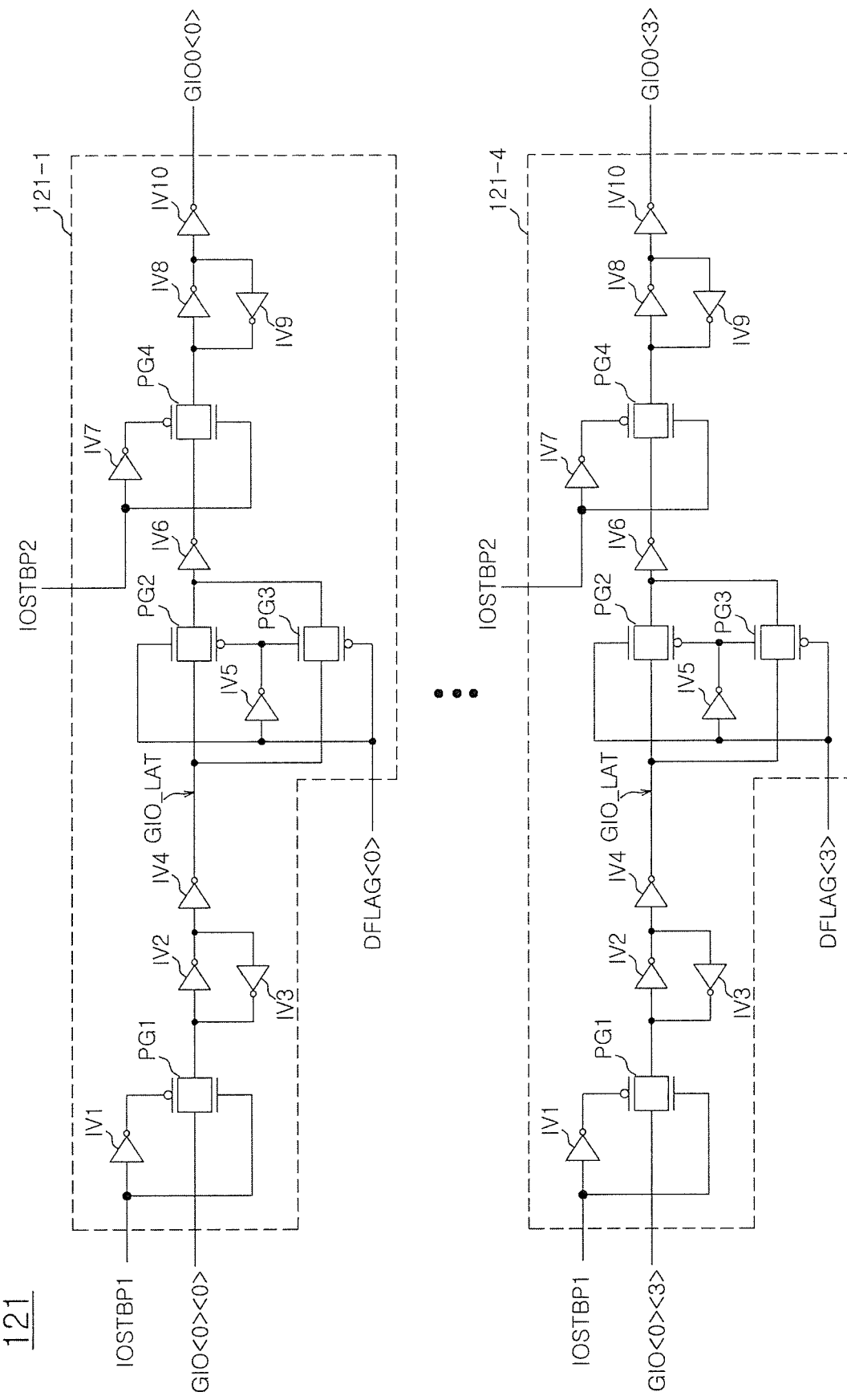
FIG. 5 is a circuit diagram showing an exemplary first inversion circuit unit included with the device according to an embodiment of the present invention.

FIG. 5 shows a circuit diagram of an exemplary first inversion circuit unit included with the device according to an embodiment.

As shown in FIG. 5, the first inversion circuit unit 121 includes a plurality of logic circuit units 121-1 to 121-4 to perform a data inversion operation on each data of the data set 'GIO<0><0:3>'.

The plurality of logic circuit units 121-1 to 121-4 each has the same structure.

The logic circuit unit 121-1 latches the data 'GIO<0><0>' based on the timing of the first input/output strobe signal 'IOSTBP<1>', inverts the data according to the DBI flag signal 'DFLAG<0>', latches the data based on the timing of the second input/output strobe signal 'IOSTBP<2>', and outputs the data to the first data output unit 130. The logic circuit unit 121-1 is implemented using a plurality of inverters IV1 to IV10 and a plurality of pass gates PG1 to PG4.

Figure 6:
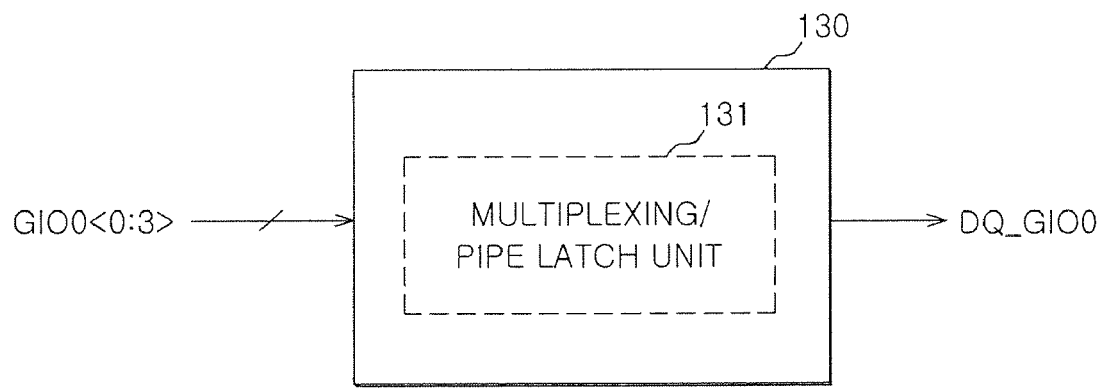
FIG. 6 is a block diagram showing an internal structure of an exemplary first data output unit included with the device according to an embodiment of the present invention.

FIG. 6 shows a block diagram of an internal structure of an exemplary first data output unit included with the device according to an embodiment.

As shown in FIG. 6, the first data output unit 130 multiplexes the data set output from the first inversion circuit unit 121, latches the data set in a predetermined order, and outputs the data set to the first pad 210. The first data output unit 130 may be implemented using a MULTIPLEXING/PIPE LATCH unit 131. The MULTIPLEXING/PIPE LATCH unit 131 may be implemented using a multiplexer and a pipe latch used in a typical semiconductor integrated circuit.

Hereinafter, the operation of the semiconductor integrated circuit having a data bus inversion function according to an embodiment will be described.

FIG. 7 is a timing chart showing the operation of an exemplary semiconductor integrated circuit device according to an embodiment.

The DBI flag generating unit 110 performs a predetermined DBI operation on all of the data 'GIO<0:7><0:3>' transmitted through the global transmission lines and generates the DBI flag signals 'DFLAG<0:3>'.

Referring to FIG. 5, the data inverting unit 120 latches the data 'GIO<0:7><0:3>' input through the global lines based on the timing of the first input/output strobe signal 'IOSTBP<1>', and generates latch data 'GIO_LAT'.

The data inverting unit 120 inverts the latch data 'GIO_LAT' according to the DBI flag signals 'DFLAG<0:3>', latches the latch data based on the timing of the second input/output strobe signal 'IOSTBP<2>', and outputs the latched data to the first to eighth data output units 130 to 200.

The first input/output strobe signal 'IOSTBP<1>' may be generated with a read command 'RD<0>' (or a write command), and the second input/output strobe signal 'IOSTBP<2>' may be generated having a time difference corresponding one clock with the first input/output strobe signal 'IOSTBP<1>'. The second input/output strobe signal 'IOSTBP<2>' may be generated by delaying the first input/output strobe signal 'IOSTBP<1>' by one clock.

The first to eighth data output units 130 to 200 multiplexes the data 'DQ_GIO0' to 'DQ_GIO7', latches the data in a predetermined order, and outputs the data to the first to eighth pads 210 to 280.

As described above, according to an embodiment, the data inversion operation according to the DBI flag signals may be completed by the data inverting unit provided between the global transmission lines, and the data on which the data inversion operation has been completed is transmitted through the global transmission lines. Accordingly, the data output unit performs the operation for determining data order. That is, the data inversion operation is collectively performed, data input/output control is simply performed, stable and accurate data input and output is facilitated, and an area of the data output unit is reduced.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor integrated circuit, comprising:
    a data bus inversion (DBI) flag generating unit configured to generate DBI flag signals using a plurality of output data sets;
    a data inverting unit configured to invert the plurality of output data sets according to the DBI flag signals and transmit the plurality of output data sets through global transmission lines; and
    a plurality of data output units configured to output the plurality of output data sets, which are transmitted through the global transmission lines by pads.

2. The semiconductor integrated circuit of claim 1, wherein the data inverting unit comprises:
    a plurality of inversion circuit units to invert and output the plurality of output data sets based on a timing of an input/output strobe signal in accordance with the DBI flag signals.

3. The semiconductor integrated circuit of claim 2, wherein the inversion circuit units are configured to latch the output data sets based on the timing of the input/output strobe signal to generate latch data, invert the latch data according to the DBI flag signals, and output the data.

4. The semiconductor integrated circuit of claim 2, wherein the data output units are configured to multiplex and latch the output data sets from the data inverting unit and output the output data sets through the pads connected to the respective data output units.

5. A semiconductor integrated circuit, comprising:
    a plurality of pads;
    a plurality of data output units configured to multiplex and latch input data and output the data to the plurality of pads;
    global transmission lines configured to be connected between a memory cell area and the plurality of data output units; and
    a data inverting unit coupled to the center of the global transmission lines, and configured to invert data transmitted from the memory cell area according to data bus inversion (DBI) flag signals and output the data to the plurality of data output units.

6. The semiconductor integrated circuit of claim 5, wherein the data inverting unit comprises:
    a plurality of inversion circuit units to invert and output the data based on a timing of an input/output strobe signal in accordance with the DBI flag signals.

7. The semiconductor integrated circuit of claim 6, wherein the inversion circuit units are configured to latch the data based on the timing of the input/output strobe signal to generate latch data, invert the latch data according to the DBI flag signals, and output the data.

8. The semiconductor integrated circuit of claim 6, wherein the data output units are configured to multiplex and latch the data output from the data inverting unit and output the data through the respective pads connected to the data output units.

9. A semiconductor integrated circuit, comprising:
    a plurality of data output units configured to latch data transmitted through global transmission lines in a predetermined order and output the data to pads connected to the plurality of respective data output units; and
    a data inverting unit configured to invert data output from a memory cell area based on a timing of at least one input/output strobe signal in accordance with data bus inversion (DBI) flag signals and transmit the data to the plurality of data output units through the global transmission lines.

10. The semiconductor integrated circuit of claim 9, wherein the data inverting unit is configured to invert latch data, which is generated by latching the data based on the timing of a first input/output strobe signal, in accordance with the DBI flag signals to generate inversion data, and latch the inversion data based on a timing of a second input/output strobe signal and output the inversion data.

11. The semiconductor integrated circuit of claim 10, wherein the first input/output strobe signal is generated based on a read command or a write command.

12. The semiconductor integrated circuit of claim 11, wherein the second input/output strobe signal is activated based on a predetermined time difference after the first input/output strobe signal is activated.

* * * * *